(12) United States Patent
Yu et al.

(10) Patent No.: US 8,871,609 B2
(45) Date of Patent: Oct. 28, 2014

(54) THIN WAFER HANDLING STRUCTURE AND METHOD

(75) Inventors: Chen-Hua Yu, Hsinchu (TW);
Kuo-Ching Hsu, Chung-Ho (TW);
Chen-Shien Chen, Zhubei (TW);
Ching-Wen Hsiao, Banqiao (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 0 days.

(21) Appl. No.: 12/818,362

(22) Filed: Jun. 18, 2010

(65) Prior Publication Data

US 2010/0330788 A1    Dec. 30, 2010

Related U.S. Application Data

(60) Provisional application No. 61/221,890, filed on Jun. 30, 2009.

(51) Int. Cl.
| H01L 21/30 | (2006.01) |
| H01L 21/46 | (2006.01) |
| H01L 21/683 | (2006.01) |
| H01L 21/18 | (2006.01) |
| H01L 21/26 | (2006.01) |
| H01L 21/265 | (2006.01) |

(52) U.S. Cl.
CPC ........ *H01L 21/187* (2013.01); *H01L 21/6835* (2013.01); *H01L 2221/68381* (2013.01); *H01L 2221/68327* (2013.01); *H01L 2221/68318* (2013.01)
USPC ............. 438/458; 257/E21.328; 257/E21.334

(58) Field of Classification Search
USPC ................ 257/E21.215, E21.294, E21.328, 257/E21.334; 438/458–459, 514, 584, 689, 438/795
See application file for complete search history.

(56) References Cited

U.S. PATENT DOCUMENTS

| 5,391,917 A | 2/1995 | Gilmour et al. |
| 5,510,298 A | 4/1996 | Redwine |

(Continued)

FOREIGN PATENT DOCUMENTS

| TW | 200818255 | 6/1996 |
| TW | 529095 | 4/2003 |

(Continued)

OTHER PUBLICATIONS

"3M Wafer Support System: For Ultra-Thin Wafer Backgrinding—down to Microns", 3M Industries Business, St. Paul, MN, 2004, 1-4.

(Continued)

*Primary Examiner* — Calvin Choi
(74) *Attorney, Agent, or Firm* — Lowe Hauptman & Ham, LLP

(57) ABSTRACT

A thin wafer handling structure includes a semiconductor wafer, a release layer that can be released by applying energy, an adhesive layer that can be removed by a solvent, and a carrier, where the release layer is applied on the carrier by coating or laminating, the adhesive layer is applied on the semiconductor wafer by coating or laminating, and the semiconductor wafer and the carrier is bonded together with the release layer and the adhesive layer in between. The method includes applying a release layer on a carrier, applying an adhesive layer on a semiconductor wafer, bonding the carrier and the semiconductor wafer, releasing the carrier by applying energy on the release layer, e.g. UV or laser, and cleaning the semiconductor's surface by a solvent to remove any residue of the adhesive layer.

18 Claims, 2 Drawing Sheets

(56) References Cited

U.S. PATENT DOCUMENTS

| | | |
|---|---|---|
| 5,767,001 A | 6/1998 | Bertagnolli et al. |
| 5,998,292 A | 12/1999 | Black et al. |
| 6,184,060 B1 | 2/2001 | Siniaguine |
| 6,206,441 B1 | 3/2001 | Wen et al. |
| 6,214,733 B1 * | 4/2001 | Sickmiller .................. 438/691 |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,543,988 B2 | 4/2003 | Hsiao et al. |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,462,551 B2 | 12/2008 | Kulkarni et al. |
| 2003/0008437 A1 * | 1/2003 | Inoue et al. .................. 438/149 |
| 2006/0231527 A1 * | 10/2006 | Takayama et al. ............. 216/62 |
| 2008/0099149 A1 * | 5/2008 | Codding et al. .............. 156/382 |
| 2008/0182363 A1 * | 7/2008 | Amrine et al. ................ 438/118 |
| 2009/0039496 A1 * | 2/2009 | Beer et al. .................... 257/693 |
| 2009/0075217 A1 * | 3/2009 | Brodsky ....................... 430/327 |
| 2009/0197390 A1 * | 8/2009 | Rothwell et al. ............. 438/455 |
| 2009/0218560 A1 * | 9/2009 | Flaim et al. ....................... 257/9 |
| 2010/0148353 A1 * | 6/2010 | Kim et al. .................... 257/698 |
| 2010/0263794 A1 * | 10/2010 | George et al. ................ 156/344 |
| 2010/0330788 A1 | 12/2010 | Yu et al. |

FOREIGN PATENT DOCUMENTS

| | | |
|---|---|---|
| TW | 544739 | 8/2003 |
| TW | 200842174 | 11/2008 |
| TW | 200842957 | 11/2008 |
| WO | WO 2004/006296 | 1/2004 |

OTHER PUBLICATIONS

Office Action dated Mar. 26, 2013 from corresponding application No. TW099121418.

Office Action dated Jul. 28, 2014 from corresponding application No. TW 099121418.

* cited by examiner

THIN WAFER HANDLING STRUCTURE AND METHOD

CROSS-REFERENCE TO RELATED APPLICATIONS

The present application claims priority of U.S. Provisional Patent Application Ser. No. 61/221,890 filed on Jun. 30, 2009 which is incorporated herein by reference in its entirety.

TECHNICAL FIELD

This disclosure relates generally to wafer processing and more particularly to a thin wafer handling structure and method to facilitate bonding and debonding.

BACKGROUND

In semiconductor wafer processing, temporary bonding and debonding techniques are necessary for thin wafer backside processes. The wafer is bonded on rigid carrier by adhesive layers. After grinding and/or other post-bonding processes the wafer is debonded from the rigid carrier.

One of the conventional debonding methods uses a laser on a light-to-heat conversion layer (LTHC) to release the carrier, and then peel off the adhesive. The adhesive material is UV-cured material, e.g. thermal setting polymer that cannot be stripped by chemicals and should be peeled off instead. This method suffers chemical residue after debonding. Also, the laser release layer has a weak chemical resistance during backside processes.

Another conventional method uses chemical release. This method chemically dissolves the adhesive to release the wafer from the carrier. This method needs perforated glass and easily induces cross contamination. The process speed, e.g. wafers per hour (WPH) is also slow compared to the other methods.

Yet another conventional method is thermal sliding. This method treats the wafer and carrier with heat and then slides them apart. This method needs higher debonding temperatures and may adversely impact the interconnection scheme.

Accordingly, new structure and methods are desired for a robust wafer bonding to ensure surface cleanness after debonding and to have good chemical resistance during post-bonding processes.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the invention.

A thin wafer handling structure and method to facilitate bonding and debonding for wafer process are provided. Throughout the various views and illustrative embodiments of the present disclosure, like reference numbers are used to designate like elements.

Figure 1:
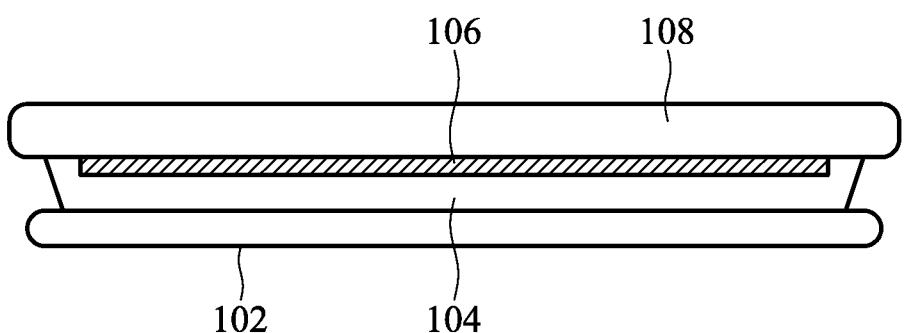
FIG. 1 illustrates an example of a thin wafer handling structure to facilitate bonding and debonding according to one aspect of the present disclosure.

FIG. 1 illustrates an example of a thin wafer handling structure to facilitate bonding and debonding according to one aspect of the present disclosure. The wafer 102 is bonded on the carrier 108 using two layers in between, i.e. the release layer 106 and the adhesive layer 104. The release layer 106 is applied on carrier 108 by coating or lamination processes followed by removal of the outer most 0.1 mm-3 mm of the release layer 106 from the edge of the carrier by edge bead removal (EBR).

EBR removes a build-up of material at the wafer edges. Without any intervention, excess material may accumulate at the edge of the wafer at up to several times the nominal thickness of the layer. Such a condition would present a significant contamination risk for process equipment. For chemical EBR, solvent is dispensed on the edge of the wafer as the wafer is rotated immediately after coating.

The adhesive layer 104 is applied on wafer 102 by coating or lamination process, and should be capable of being removed by solvent, e.g. thermal plastic polymer can be used as the adhesive layer 104 in one preferred embodiment. The carrier 108 and the wafer 102 are bonded together by UV light or thermal energy.

Figure 2:
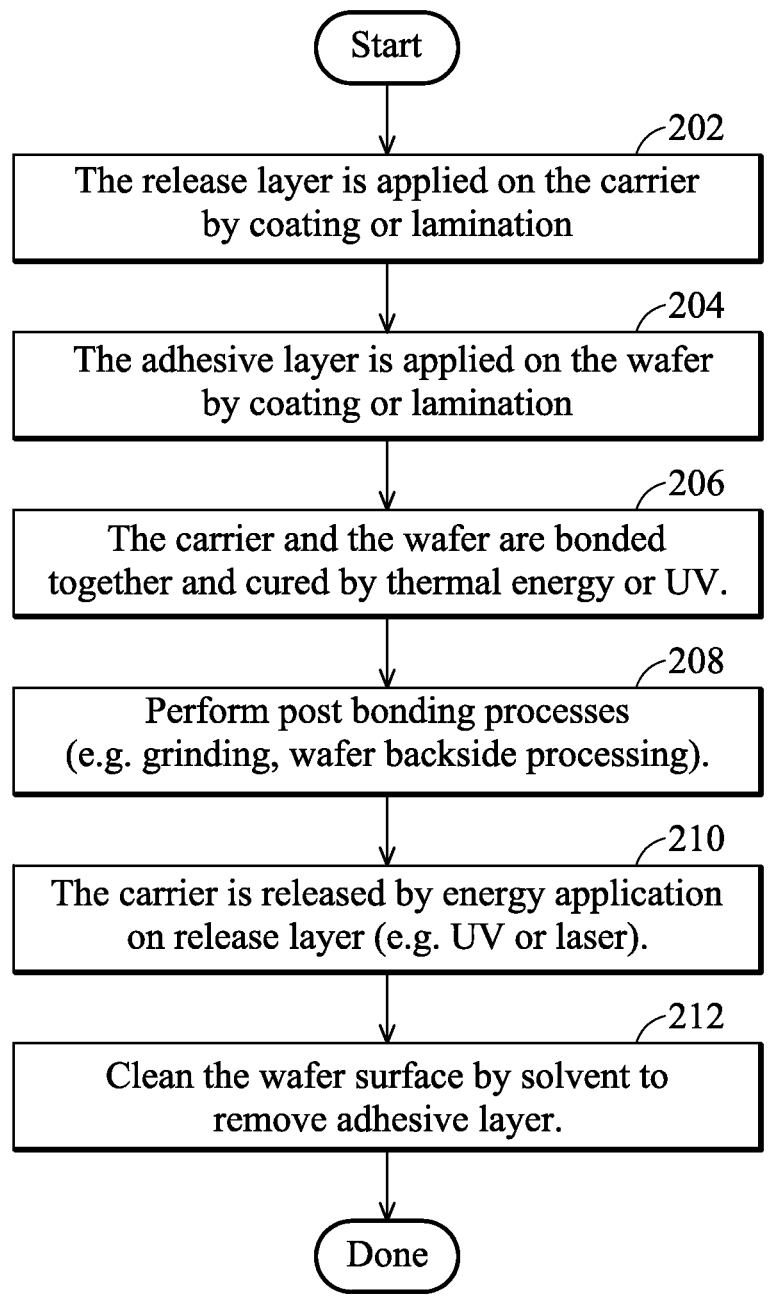
FIG. 2 illustrates an example method to facilitate thin wafer bonding and debonding according to another aspect of the present disclosure.

FIG. 2 illustrates an example method to facilitate thin wafer bonding and debonding according to another aspect of the present disclosure. At step 202, the release layer 106 is applied on the carrier 108 by coating or lamination. Spin coating can be used for adhesive layer application according to one embodiment. At step 204, the adhesive layer 104 is applied on the wafer 102 by coating or lamination. At step 206, the carrier 108 and the wafer 102 are bonded together with the release layer 106 and the adhesive layer 104 in between and cured by thermal energy or UV light. The adhesive can be pre-baked prior to bonding. At step 208, the wafer goes through post-bonding processes, e.g. grinding, wafer backside processing, etc. The wafer backside processing may include ion implantation, annealing, etching, sputtering, evaporation, and/or metallization, etc.

After the post-bonding processes, the wafer goes through the debonding processes, which includes carrier release and post cleaning. At step 210, the carrier 108 is released by energy application on the release layer 106, e.g. UV light or light from a laser. The thin wafer 102 can be attached on dicing frame for dicing tape lamination prior to releasing the carrier. Then the wafer 102 surface is cleaned by chemical soaking in solvent to remove any residue of the adhesive layer 104. For example, an adhesive layer 104 using thermal plastic polymer can be chemically cleaned with a solvent. A skilled person in the art will appreciate that there can be many embodiment variations of this disclosure.

The advantageous features of the present disclosure include surface cleanness after debonding and good chemical resistance during post-bonding processes.

Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A thin wafer handling structure, comprising:
   a semiconductor wafer;
   a carrier;
   a release layer coated or laminated on the carrier, said release layer being releasable upon application of energy thereto, wherein the release layer has an outer edge spaced radially inward from an outer edge of the carrier and exposes a peripheral portion of the carrier; and
   an adhesive layer coated or laminated on the semiconductor wafer, said adhesive layer being removable by a solvent;
   wherein the semiconductor wafer and the carrier are bonded together with the release layer and the adhesive layer in between the semiconductor wafer and the carrier, and
   wherein an adhesive material of the adhesive layer has a first surface in direct contact with the semiconductor wafer and a second surface in direct contact with the release layer, the adhesive material directly contacts the exposed peripheral portion of the carrier, and the adhesive material extends continuously from the first surface to the second surface.

2. The structure of claim 1, wherein the carrier and the semiconductor wafer are bonded together by the adhesive which is in a UV-cured or thermally-cured state.

3. The structure of claim 1, wherein the outer edge of the release layer is radially, inwardly spaced by 0.1 mm-3 mm from the outer edge of the carrier.

4. The structure of claim 1, wherein the release layer is releasable upon application of at least one of UV light or light from a laser.

5. The structure of claim 1, wherein the adhesive layer is thermal plastic polymer.

6. A method, comprising:
   applying a release layer on a carrier by at least one of coating or lamination, the release layer exposing a peripheral portion of the carrier;
   applying an adhesive layer to a surface of a semiconductor wafer by at least one of coating or lamination;
   bonding the carrier and the semiconductor wafer with the release layer and the adhesive layer in between the carrier and the semiconductor wafer, wherein the adhesive layer is between the semiconductor wafer and the release layer, and the adhesive layer directly contacts the exposed peripheral portion of the carrier;
   releasing the carrier by applying energy to the release layer; and
   chemically cleaning the surface of the semiconductor wafer with a solvent to remove any residue of the adhesive layer from the surface of the semiconductor wafer.

7. The method of claim 6, further comprising performing a post-bonding process on the semiconductor wafer.

8. The method of claim 7, wherein the post-bonding process includes at least one of grinding or wafer backside processing.

9. The method of claim 8, wherein the wafer backside processing includes at least one of ion implantation, annealing, etching, sputtering, evaporation or metallization.

10. The method of claim 6, wherein the carrier and the semiconductor wafer are bonded together by applying UV light or thermal energy.

11. The method of claim 6, wherein the release layer is released by applying UV light or light from a laser.

12. The method of claim 6, wherein the adhesive layer is thermal plastic polymer.

13. The method of claim 6, further comprising: performing an edge bead removal (EBR) process on the release layer to expose the peripheral portion of the carrier after said at least one of coating or lamination of the release layer onto the carrier.

14. The method of claim 13, wherein the EBR process removes the outer most 0.1 mm-3 mm of the release layer from an outer edge of the carrier.

15. A method, comprising:
   applying a release layer to a carrier by at least one of coating or lamination;
   performing an edge bead removal (EBR) process on the release layer, after applying the release layer to the carrier, to remove the outermost 0.1 millimeter (mm) to 3 mm of the release layer from an outer edge of the carrier;
   applying an adhesive layer to a surface of a semiconductor wafer by at least one of coating or lamination;
   bonding the carrier and the semiconductor wafer with the release layer and the adhesive layer in between the carrier and the semiconductor wafer by applying UV light or thermal energy, wherein said bonding comprises the adhesive layer directly contacting a peripheral portion of the carrier from which the release layer has been removed;
   performing a post-bonding process on the semiconductor wafer;
   releasing the carrier by applying UV light or light from a laser to the release layer; and
   soaking the semiconductor wafer in a solvent to chemically clean any residue of the adhesive layer from the surface of the semiconductor wafer with the solvent,
   wherein said bonding is performed after said applying the release layer and said applying the adhesive layer, and in said bonding, an adhesive material of the adhesive layer has a first surface in direct contact with the semiconductor wafer and a second surface in direct contact with the release layer, and the adhesive material extends continuously from the first surface to the second surface.

16. The method of claim 15, wherein the post-bonding process includes at least one of grinding or wafer backside processing.

17. The method of claim 16, wherein the wafer backside processing includes at least one of ion implantation, annealing, etching, sputtering, evaporation, or metallization.

18. The method of claim 15, wherein the adhesive layer is thermal plastic polymer.

\* \* \* \* \*